US006248947B1

(12) United States Patent
Enke

(10) Patent No.: US 6,248,947 B1
(45) Date of Patent: Jun. 19, 2001

(54) TRANSDUCER FOR MUSICAL INSTRUMENTS

(75) Inventor: David Martin Enke, La Veta, CO (US)

(73) Assignee: Pick-up the World, Inc., La Veta, CO (US)

( * ) Notice: Subject to any disclaimer, the term of this patent is extended or adjusted under 35 U.S.C. 154(b) by 0 days.

(21) Appl. No.: 09/564,146

(22) Filed: May 3, 2000

Related U.S. Application Data

(60) Provisional application No. 60/179,085, filed on Jan. 31, 2000, and provisional application No. 60/179,069, filed on Jan. 31, 2000.

(51) Int. Cl.[7] .......................... G10H 3/00; H01L 41/087; H04R 17/00

(52) U.S. Cl. ...................... 84/730; 84/DIG. 24; 310/334; 310/370; 29/25.35

(58) Field of Search .................... 84/730–732, DIG. 24; 310/334–337, 370; 29/25.35

(56) References Cited

U.S. PATENT DOCUMENTS

| | | | |
|---|---|---|---|
| 4,727,634 | 3/1988 | Fishman | 29/25.35 |
| 5,123,325 | 6/1992 | Turner | 84/731 |
| 5,204,487 | 4/1993 | Turner | 84/731 |
| 5,319,153 | 6/1994 | Fishman | 84/731 |
| 5,670,733 | 9/1997 | Fishman | 84/731 |
| 5,817,966 | 10/1998 | Fishman | 84/731 |
| 5,866,835 | 2/1999 | Baggs | 84/731 |
| 5,900,572 | 5/1999 | Aaroe | 84/731 |
| 6,023,019 | 2/2000 | Baggs | 84/731 |

*Primary Examiner*—Stanley J. Witkowski
(74) *Attorney, Agent, or Firm*—William E. Hein

(57) ABSTRACT

A transducer for musical instruments formed as a sandwich structure that utilizes a length of polarized fluoropolymer polyvinylidene fluoride (PVDF) film folded over itself to form a U-shape over a center conductor of a length of shielded coaxial cable. Conductive silver epoxy is used to attach the center conductor of the coaxial cable to the inner surface electrode of the PVDF film. A length of double-sided tape is sandwiched between the two legs of the U-shaped PVDF film. The free end of the coaxial cable is folded over a side edge of the U-shaped PVDF film such that an outer shield of the coaxial cable is exposed outside the PVDF film. A U-shaped brass channel, whose inner surface has been coated with conductive epoxy, is then crimped over both the outer shield of the coaxial cable and the U-shaped end of the laminated PVDF film to form a transducer assembly, which is then laminated to a length of double-sided tape having an outer removable backing layer. The free end of the coaxial cable may be terminated in any desired type of audio connector. In use, the backing layer of the double-sided tape is removed to permit adhesive mounting of the transducer assembly to a desired acoustic surface to be monitored.

16 Claims, 2 Drawing Sheets

TRANSDUCER FOR MUSICAL INSTRUMENTS

REFERENCE TO RELATED APPLICATIONS

This application claims the benefit of U.S. Provisional Patent Applications Ser. Nos. 60/179,069 and 60/179,085, both of which were filed on Jan. 31, 2000.

BACKGROUND OF THE INVENTION

The present invention relates generally to transducers or pickups for musical instruments and, more particularly, to an improved transducer that is flexible, shielded, light weight, accurate, and repositionable, and that may conveniently be used with a variety of stringed and percussive instruments.

Existing products for recording and amplifying sounds produced by musical instruments generally fall into the categories of microphones, magnetic pickups, contact pickups, and in-the-saddle pickups.

Microphones are generally expensive and have inherent frequency response limitations due to the size, shape, and mass of the diaphragm element that produces the electrical signal. Microphones require air pressure to actuate a diaphragm, which in turn produces an electrical signal. Thus, the electrical signal is not produced instantaneously, but is instead slightly delayed due to the compressive nature of air. Furthermore, microphones have a resonant frequency in the range of 8 kHz–14 kHz, which colors the sound produced with an un-natural boost in output in that frequency range.

Magnetic pickups require the use of ferrous metal strings on the instrument to which they are attached and are placed in positions along the length of those strings in order to produce electrical images of the strings at those harmonic points. The total harmonic content of the signal is limited to the position of the pickup. Magnetic pickups exert a very strong magnetic force on the instrument strings, thereby altering their natural movements and reducing sustain, harmonic balance, and string energy considerably. Magnetic pickups are not practical for use with instruments having more than twelve strings, such as pianos, since the length of the coil windings and the weight of the magnets would substantially reduce the performance of those types of instruments.

Contact pickups are usually rigid ceramic/crystalline piezo materials that are typically deposited onto rigid metal substrates. Most of these pickups are further limited by being encapsulated into plastic cases using epoxy resins. The resulting rigidity and mass diminishes the accurate performance of the pickup. The mass creates audible resonant frequencies, and also alters the natural sound of the instrument. Ceramic piezo materials have a mass that creates a non-musical self resonance between 6 and 16 kHz, and they exhibit a very non-linear frequency response that resembles white noise.

In-the-saddle pickups place a compressible material precisely at the point where the string energy enters the body of the instrument through the bridge, thus noticeably altering the natural tone, sustain, and dynamic response. Saddle pickups respond primarily to the strings of the instrument, rather than to the instrument itself. String balance is difficult to achieve with saddle pickups, resulting in one or more of the strings being too loud or too quiet, relative to the others.

Exemplary of prior art transducers or pickups are those described in U.S. Pat. No. 4,727,634 to Fishman, U.S. Pat. No. 5,123,325 to Turner, U.S. Pat. No. 5,204,487 to Turner, U.S. Pat. No. 5,319,153 to Fishman, U.S. Pat. No. 5,670,733 to Fishman, U.S. Pat. No. 5,817,966 to Fishman, U.S. Pat. No. 5,866,835 to Baggs, U.S. Pat. No. 5,900,572 to Aaroe, and U.S. Pat. No. 6,023,019 to Baggs.

SUMMARY OF THE INVENTION

The present invention is directed to a transducer for musical instruments, the transducer being a sandwich structure that utilizes a length of polarized fluoropolymer polyvinylidene fluoride (PVDF) film folded over itself to form a U-shape over a center conductor of a length of shielded coaxial cable. Conductive silver epoxy is used to attach the center conductor to the inner surface electrode of the PVDF film. A length of double-sided tape is sandwiched between the two legs of the folded U-shape PVDF film. The free end of the coaxial cable is bent over a side edge of the folded U-shaped PVDF film such that an outer shield of the coaxial cable is exposed to the outside of the PVDF film. A U-shaped brass channel, whose inner surface has been coated with conductive epoxy, is then crimped over both the outer shield of the coaxial cable and the closed end of the laminated U-shape PVDF film to form a transducer assembly, which is then laminated to a length of double-sided tape having an outer removable backing layer. The free end of the coaxial cable may be terminated in any desired type of audio connector. In use, the backing layer of the double-sided tape is removed to permit adhesive mounting of the transducer assembly to a desired acoustic surface to be monitored.

DETAILED DECRIPTION OF THE INVENTION

Figure 1:
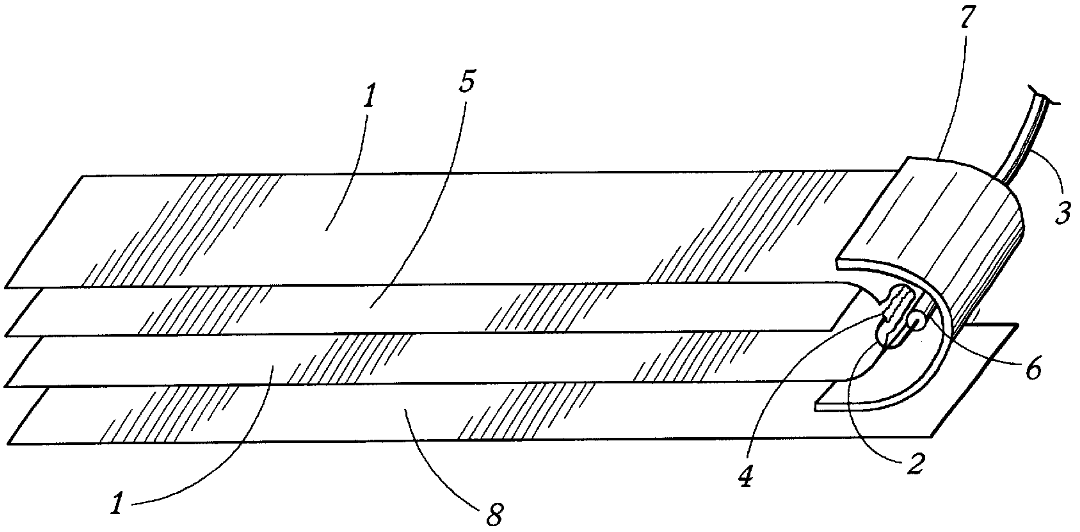
FIG. 1 is a pictorial diagram of a transducer assembly for musical stringed instruments in accordance with the preferred embodiment of the present invention.

Referring now to FIG. 1, there is shown a transducer assembly in which an elongated piece of commercially available polarized fluoropolymer polyvinylidene fluoride (PVDF) film 1 is folded over itself to form a U-shape with legs of equal length around a center conductor 2 of a length of high grade shielded coaxial cable 3. Commercially available conductive silver epoxy 4 is used to attach center conductor 2 of coaxial cable 3 to the inner surface (inner electrode) of PVDF film 1. A length of double-sided machinist's tape or other suitable double-sided tape 5 is laminated between the two legs of the folded U-shape PVDF film 1. The free end of the length of coaxial cable 3 is then folded over a side edge of the U-shape, laminated PVDF film 1 such that an outer shield 6 of the coaxial cable 3 is exposed outside the PVDF film 1. The inner surface of a U-shaped brass channel 7 is first coated with conductive epoxy and then crimped over the outer shield 6 of the coaxial cable 3 and over the closed end of the U-shape PVDF film 1 to form a transducer assembly, which is then laminated to a length of double-sided tape 8 having an outer removable backing layer. The free end of the coaxial cable 3 may be terminated in any desired type of audio connector. In use, the backing layer of the double-sided tape 8 is removed, thus permitting adhesive mounting of the transducer assembly to a desired acoustic surface to be monitored.

Figure 2:
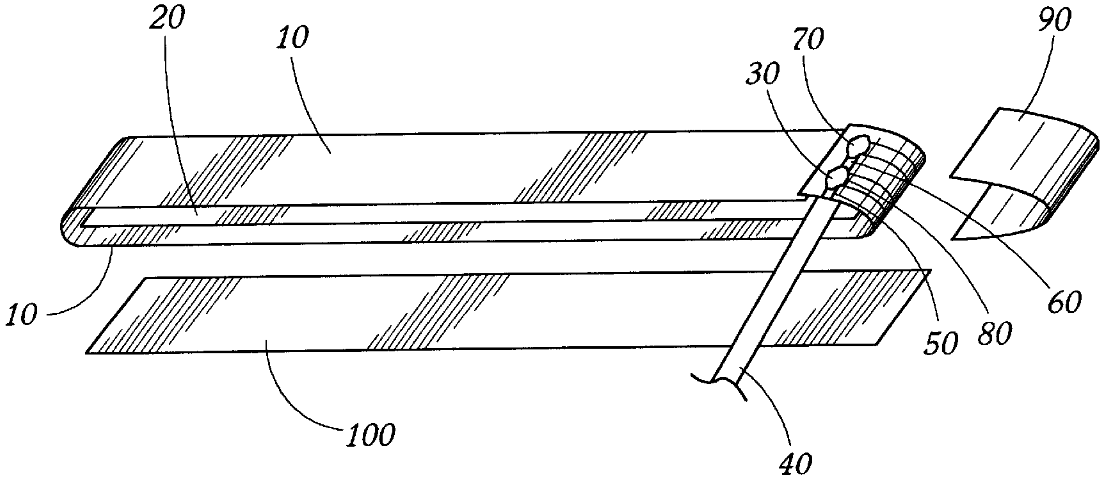
FIG. 2 is a pictorial diagram of a transducer assembly for musical stringed instruments in accordance with a first alternative embodiment of the present invention.

Referring now to FIG. 2, there is shown a first alternative embodiment of the transducer of the present invention in which an elongated piece of commercially available polarized fluoropolymer polyvinylidene fluoride (PVDF) film 10, having electrodes sputtered on inner and outer surfaces thereof, is folded over itself to form a U-shape with legs of equal length. PVDF film 10 includes leads at a distal end thereof away from the fold and a hole 50 through an electrode 30 on the outer surface of PVDF film 10. A length of fine coaxial wire 40 is prepared by pulling back and twisting a length of its outer shield, which is then inserted in the hole 30 of the PVDF film 10. A strain relief is formed by bending the length of twisted shield of coaxial wire 40 backward toward the free end thereof. Next, the center conductor 60 of coaxial wire 40 is trimmed and attached to the inner electrode on the inner surface of PVDF film 10 by means of a conductive epoxy 70. Hole 50 is then covered with a conductive epoxy 80. A thin brass U-shaped channel 90 is then crimped over the distal end of PVDF film 10, at which connections to coaxial wire 40 have been made, and is secured by applying a medium viscosity glue over each open end of U-shaped channel 90 to complete the transducer assembly. Finally, the completed transducer assembly is laminated to a length of double-sided tape 100 having an outer removable backing layer. The free end of the coaxial wire 40 may be terminated in any desired type of audio connector. In use, the backing layer of the double-sided tape 100 is removed, thus permitting adhesive mounting of the transducer assembly to a desired acoustic surface to be monitored.

Figure 3A:
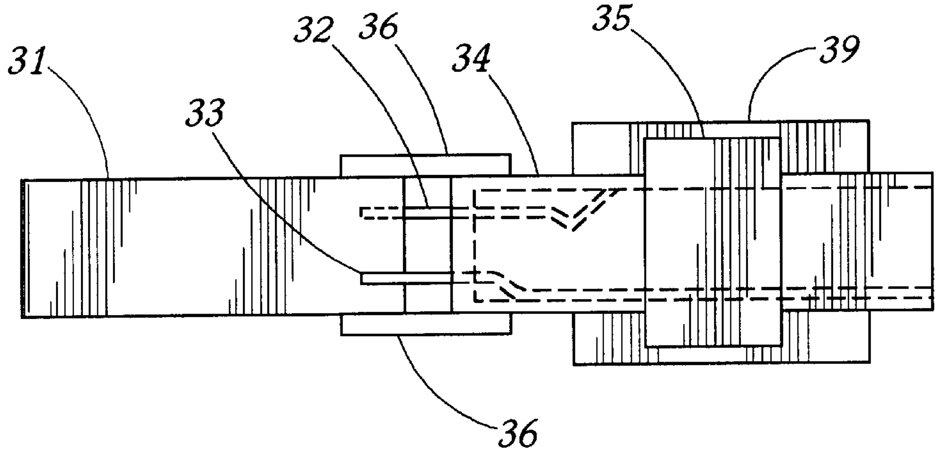
FIG. 3A is a top plan view of a transducer assembly for musical percussive instruments in accordance with a second alternative embodiment of the present invention.
Figure 3B:
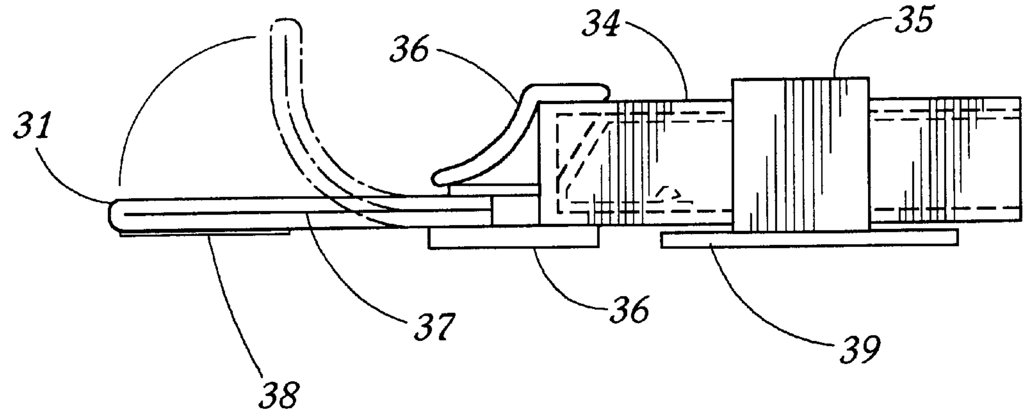
FIG. 3B is a front elevation view of the transducer assembly of FIG. 3A.

Referring now to FIGS. 3A–B, there is shown a second alternative embodiment of the transducer of the present invention in which an audio jack is integrally coupled thereto to facilitate use of the transducer on drums and small musical instruments. In this embodiment, a length of PVDF film 31 is folded over a length of double-sided tape 37. An inner electrode on the inner surface of the folded over PVDF film 31 is attached to the signal lead 32 of a conventional audio jack 34 by means of conductive epoxy. The outer electrode on the outer surface of the folded over PVDF film 31 is attached to the ground lead 33 of the audio jack 34, also by means of conductive epoxy. The resulting assembly is physically reinforced by means of a length of heat shrink tubing 36 that is positioned over the connection area of PVDF film 31 and audio jack 34. The cavity within the length of heat shrink tubing 36 is then filled with non-conductive epoxy. Next, the body of audio jack 34 is positioned within a clip 35 having a length of foam mounting tape 39, including a removable outer backing layer, attached to the bottom thereof. The folded over PVDF film 31 is laminated to a length of double-sided tape 38, also having an outer removable backing layer. In use, the backing layers of both the foam mounting tape 39 and the double-sided tape 38 are removed to permit adhesive mounting of the transducer assembly to a desired acoustic surface to be monitored. The lengths of foam mounting tape 39 and double-sided tape 38 may be easily replaced in the event the transducer assembly is repeatedly repositioned.

I claim:

1. A transducer assembly for attachment to a musical instrument, the transducer assembly comprising:

a length of polarized fluoropolymer polyvinylidene fluoride (PVDF) film folded over itself to form a U-shape having legs of equal length, an inner surface of the folded U-shape PVDF film forming a first electrode of said transducer assembly and an outer surface of the folded U-shape PVDF film forming a second electrode of said transducer assembly;

a length of shielded coaxial cable having a center conductor covered by an insulating material and having a braided shield surrounding the insulated material, one end of the length of shielded coaxial cable being prepared by removing the insulating material and braided shield to expose a length of the center conductor, the exposed length of the center conductor being positioned within the legs of the folded U-shape PVDF film at a closed end thereof and being attached to said inner surface of the folded U-shape PVDF film by means of a conductive epoxy material, the length of shielded coaxial cable being folded over a side edge of the folded U-shape PVDF film to bring a length of said braided shield into contact with said outer surface of the folded U-shape PVDF film;

a length of double-sided tape sandwiched between said legs of the folded U-shape PVDF film;

a U-shaped metal channel having an inner surface coated with a conductive epoxy material, said U-shaped metal channel being crimped over both said length of said braided shield and said closed end of the folded U-shape PVDF film; and a length of double-sided tape having an outer removable layer, said length of double-sided tape being adhesively attached to one leg of the folded U-shape PVDF film.

2. A transducer assembly as in claim 1, wherein said U-shaped metal channel comprises brass.

3. A transducer assembly as in claim 1, further comprising an audio connector coupled to a free end of said length of coaxial cable.

4. A transducer assembly for attachment to a musical instrument, the transducer assembly comprising:

a length of polarized fluoropolymer polyvinylidene fluoride (PVDF) film folded over itself to form a U-shape having legs of equal length, an inner surface of the folded U-shape PVDF film forming a first electrode of said transducer assembly and an outer surface of the folded U-shape PVDF film forming a second electrode of said transducer assembly;

a length of double-sided tape sandwiched between said legs of the folded U-shape PVDF film;

an audio jack having signal and ground leads at one end thereof, said audio jack being positioned in longitudinal alignment with the folded U-shape PVDF film such that said signal and ground leads are proximate an open end of the folded U-shape PVDF film, said outer surface of the folded U-shape PVDF film being attached to said ground lead of said audio jack by means of conductive epoxy material and said inner surface of the folded U-shape PVDF film being attached to said signal lead of said audio jack by means of conductive epoxy material; and a length of heat shrink tubing positioned over an area of attachment of said ground and signal leads of said audio jack to said outer and inner surfaces of said folded U-shape PVDF film, a cavity within said length of heat shrink tubing being filled with a non-conductive epoxy material.

5. A transducer assembly as in claim 4, further comprising:

a clip attached to said audio jack, said clip including a length of foam mounting tape having a removable outer backing layer; and a length of double-sided tape having a removable outer backing layer, said length of double-sided tape being attached to a leg of the folded U-shape PVDF film;

said clip and said length of double-sided tape facilitating attachment of said transducer assembly to an acoustic surface to be monitored.

6. A transducer assembly for attachment to a musical instrument, the transducer assembly comprising:

a length of polarized fluoropolymer polyvinylidene fluoride (PVDF) film folded over itself to form a U-shape having legs of equal length, an inner surface of the folded U-shape PVDF film forming a first electrode of said transducer assembly and an outer surface of the folded U-shape PVDF film forming a second electrode of said transducer assembly, said second electrode having a hole therein proximate an open end of the folded U-shape PVDF film;

a length of shielded coaxial cable having a center conductor covered by an insulating material and having a braided shield surrounding the insulating material, one end of the length of shielded coaxial cable being prepared by removing the insulating material and braided shield to expose a length of the center conductor and a twisted length of the braided shield, the twisted length of the braided shield being inserted in said hole in said second electrode and retained therein by means of a conductive epoxy material, the exposed length of the center conductor being positioned against said first electrode proximate said open end of the folded U-shape PVDF film and secured thereto by means of a conductive epoxy material;

a length of double-sided tape sandwiched between said legs of the folded U-shape PVDF film; and a U-shaped metal channel crimped over said open end of the folded U-shape PVDF film and secured thereto by means of an adhesive material.

7. A transducer assembly as in claim 6, further comprising:

a length of double-sided tape having an outer removable layer, said length of double-sided tape being adhesively attached to one leg of the folded U-shape PVDF film.

8. A transducer assembly as in claim 6, wherein said U-shaped metal channel comprises brass.

9. A transducer assembly as in claim 6, further comprising an audio connector coupled to a free end of said length of coaxial cable.

10. A method for fabricating a transducer assembly for attachment to a musical instrument, the method comprising the steps of:

providing a length of polarized fluoropolymer polyvinylidene fluoride (PVDF) film;

folding said length of PVDF film over itself to form a U-shape having legs of equal length, an inner surface of the folded U-shape PVDF film forming a first electrode of said transducer assembly and an outer surface of the folded U-shape PVDF film forming a second electrode of said transducer assembly;

providing a length of shielded coaxial cable having a center conductor covered by an insulating material and having a braided shield surrounding the insulating material;

preparing one end of the length of shielded coaxial cable by removing the insulating material and braided shield to expose a length of the center conductor;

positioning the exposed length of the center conductor within the legs of the folded U-shape PVDF film at a closed end thereof;

attaching the exposed length of the center conductor to said inner surface of the folded U-shape PVDF film by means of a conductive epoxy material;

folding the length of shielded coaxial cable over a side edge of the folded U-shape PVDF film to bring a length of said braided shield into contact with said outer surface of the folded U-shape PVDF film;

positioning a length of double-sided tape between said legs of the folded U-shape PVDF film;

providing a U-shaped metal channel having an inner surface coated with a conductive epoxy material;

crimping said U-shaped metal channel over both said length of said braided shield and said closed end of the folded U-shape PVDF film;

providing a length of double-sided tape having an outer removable layer; and adhesively attaching said length of double-sided tape to one leg of the folded U-shape PVDF film.

11. A method as in claim 10, further comprising the step of coupling an audio connector to a free end of said length of coaxial cable.

12. A method for fabricating a transducer assembly for attachment to a musical instrument, the method comprising the steps of:

providing a length of polarized fluoropolymer polyvinylidene fluoride (PVDF) film;

folding said length of PVDF film over itself to form a U-shape having legs of equal length, an inner surface of the folded U-shape PVDF film forming a first electrode of said transducer assembly and an outer surface of the folded U-shape PVDF film forming a second electrode of said transducer assembly;

positioning a length of double-sided tape between said legs of the folded U-shape PVDF film;

providing an audio jack having signal and ground leads at one end thereof;

positioning said audio jack in longitudinal alignment with the folded U-shape PVDF film such that said signal and ground leads are proximate an open end of the folded U-shape PVDF film;

attaching said outer surface of the folded U-shape PVDF film to said ground lead of said audio jack by means of a conductive epoxy material;

attaching said inner surface of the folded U-shape PVDF film to said signal lead of said audio jack by means of a conductive epoxy material;

positioning a length of heat shrink tubing over an area of attachment of said ground and signal leads of said audio jack to said outer and inner surfaces of said folded U-shape PVDF film; and filling a cavity within said length of heat shrink tubing with a non-conductive epoxy material.

13. A method as in claim 12, further comprising the steps of:

attaching a clip to said audio jack, said clip including a length of foam mounting tape having a removable outer backing layer;

providing a length of double-sided tape having a removable outer backing layer;

adhesively attaching said length of double-sided tape to a leg of the folded U-shape PVDF film;

removing said outer backing layer of said length of foam mounting tape and said outer backing layer of said length of double-sided tape to expose adhesive surfaces of said length of foam mounting tape and said length of double-sided tape; and adhesively attaching said transducer assembly to an acoustic surface to be monitored.

14. A method for fabricating a transducer assembly for attachment to a musical instrument, the method comprising the steps of:

providing a length of polarized fluoropolymer polyvinylidene fluoride (PVDF) film;

folding said length of PVDF film over itself to form a U-shape having legs of equal length, an inner surface of the folded U-shape PVDF film forming a first electrode of said transducer assembly and an outer surface of the folded U-shape PVDF film forming a second electrode of said transducer assembly, said second electrode having a hole therein proximate an open end of the folded U-shape PVDF film;

providing a length of shielded coaxial cable having a center conductor covered by an insulating material and having a braided shield surrounding the insulating material;

preparing one end of the length of shielded coaxial cable by removing the insulating material and braided shield to expose a length of the center conductor and a length of the braided shield;

pulling back and twisting the exposed length of the braided shield;

inserting the twisted length of the braided shield in said hole in said second electrode;

forming a strain relief by bending the twisted length of the braided shield backward toward a free end thereof;

positioning the exposed length of the center conductor against said first electrode proximate said open end of the folded U-shape PVDF film and securing it thereto by means of a conductive epoxy material;

covering said hole with a conductive epoxy material;

positioning a length of double-sided tape between said legs of the folded U-shape PVDF film;

crimping a U-shaped metal channel over said open end of the folded U-shape PVDF film; and securing said U-shaped metal channel in place over said folded U-shape PVDF film by applying an adhesive material over open ends of said U-shaped metal channel.

15. A method as in claim 14, further comprising the steps of:

providing a length of double-sided tape having an outer removable layer; and adhesively attaching said length of double-sided tape to one leg of the folded U-shape PVDF film.

16. A method as in claim 14, further comprising the step of coupling an audio connector to a free end of said length of coaxial cable.

* * * * *